(12) United States Patent
Gillis et al.

(10) Patent No.: US 8,381,050 B2
(45) Date of Patent: Feb. 19, 2013

(54) METHOD AND APPARATUS FOR INCREASED EFFECTIVENESS OF DELAY AND TRANSITION FAULT TESTING

(75) Inventors: Pamela S. Gillis, Jericho, VT (US); Jack R. Smith, South Burlington, VT (US); Tad J. Wilder, South Hero, VT (US); Francis Woytowich, Charlotte, VT (US); Tian Xia, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 600 days.

(21) Appl. No.: 12/625,703

(22) Filed: Nov. 25, 2009

(65) Prior Publication Data

US 2011/0121838 A1 May 26, 2011

(51) Int. Cl.
*G01R 31/28* (2006.01)
*G06F 11/00* (2006.01)

(52) U.S. Cl. .................. 714/731; 714/741; 714/744

(58) Field of Classification Search .................. 714/724, 714/726, 731, 741, 744
See application file for complete search history.

(56) References Cited

U.S. PATENT DOCUMENTS

| | | | |
|---|---|---|---|
| 5,831,992 A | 11/1998 | Wu | |
| 6,233,205 B1 | 5/2001 | Wells et al. | |
| 6,502,050 B1 | 12/2002 | Chan | |
| 6,769,101 B2 | 7/2004 | Stong | |
| 6,874,108 B1 | 3/2005 | Abramovici et al. | |
| 7,231,621 B1 | 6/2007 | Herron et al. | |
| 7,254,761 B2 | 8/2007 | Crowell | |
| 7,260,755 B2 | 8/2007 | Carpenter et al. | |
| 7,282,973 B1 | 10/2007 | Charagulla et al. | |
| 7,308,625 B1 | 12/2007 | Wingen et al. | |
| 7,312,631 B1 | 12/2007 | Bauer et al. | |
| 7,412,343 B2 | 8/2008 | Stroud et al. | |
| 2003/0110457 A1 | 6/2003 | Nadeau-Dostie et al. | |
| 2005/0240846 A1 | 10/2005 | Madpuwar et al. | |
| 2006/0066338 A1 | 3/2006 | Rajski et al. | |
| 2007/0288818 A1 | 12/2007 | Wang | |
| 2008/0178130 A1 | 7/2008 | He | |
| 2010/0095170 A1* | 4/2010 | Fukuda et al. ................ 714/726 |

OTHER PUBLICATIONS

Raychowdhury, A.; Ghosh, S.; Bhunia, S.; Ghosh, D.; Roy, K.; , "A novel delay fault testing methodology using on-chip low-overhead delay measurement hardware at strategic probe points," Test Symposium, 2005. European , vol., No., pp. 108-113, May 22-25, 2005.*
Gherman, V.; Wunderlich, H.-J.; Schloeffel, J.; Garbers, M.; , "Deterministic Logic BIST for Transition Fault Testing," Test Symposium, 2006. ETS '06. Eleventh IEEE European , vol., No., pp. 123-130, May 21-24, 2006.*

(Continued)

*Primary Examiner* — Cynthia Britt
(74) *Attorney, Agent, or Firm* — Gibb & Riley, LLC; Michael J. LeStrange, Esq.

(57) ABSTRACT

The invention disclosed herein provides increased effectiveness of delay and transition fault testing. The method of delay fault testing integrated circuits comprises the steps of creating a plurality of test clock gating groups. The plurality of test clock gating groups comprising elements defining inter-element signal paths within the integrated circuit. Each of the elements of the plurality of test clock gating groups share clock frequency and additional shared characteristics. At least one test signal is commonly and selectively connected through at least one low-speed gate transistor to each of the elements comprising each of the plurality of test clock gating groups based on membership in the test clock gating group. This invention can also be practiced using scan-enable gating groups for the same purposes.

25 Claims, 15 Drawing Sheets

OTHER PUBLICATIONS

Smith, Jack, "Effective Built-In Self-Testing of FPGA Interconnect Resources," A Dissertation Presented by Jack R. Smith to The Faculty of the Graduate College of The University of Vermont, Oct. 2007, pp. 1-173.

Smith, et al., "High-Resolution Delay Testing of Interconnect Paths in Field Programmable Gate Arrays," Jun. 20, 2007, pp. 1-14.

Smith, et al., "High-Precision Delay Testing of Virtex-4 FPGA Designs," 4 pages, Aug. 5-8, 2007.

Tahoori, et al., "Interconnect Delay Testing of Designs on Programmable Logic Devices," ITC International Test Conference, Paper 22.2, IEEE 2004, pp. 635-644.

Chmelar, E., "FPGA Interconnect Delay Fault Testing," ITC International Test Conference, Paper 48.1, IEEE 2003, pp. 1239-1247.

Wang, et al., "A BIBT Scheme for FPGA Interconnect Delay Faults," IEEE 23rd VLSI Test Symposium, 2005, 6 pages.

Ahmed et al., "At-Speed Transition Fault Testing with Low Speed Scan Enable," Proceedings of the 23rd IEEE VLSI Test Symposium, pp. 42-47, 2005.

* cited by examiner

| Group Assignments | | |
|---|---|---|
| Group # | Paths in group | FF |
| G1 | 1,5,9 | D |
| G2 | 2,6,8 | E |
| G3 | 11 + 1,2,3,4 | A |
| G4 | 3,10 + 5,6,7 | B |
| G5 | 4,7 + 8,9,10,11 | C |

FIGURE 11

| Test # | Paths in test (NP means no path selected) | | | | | Start Of Path (latch) | End Of Path (ORA) |
|---|---|---|---|---|---|---|---|
| | G1 | G2 | G3 | G4 | G5 | | |
| 1 | 1 | 2 | NP | 3 | 4 | A | D,E, B,C |
| 2 | 5 | 6 | NP | NP | 7 | B | D,E,C |
| 3 | 9 | 8 | 11 | 10 | NP | C | D,E, A,B |

Only 3 configurations to check delay fault in all 11 paths!

Tests 1 and 3 check four paths simultaneously

FIGURE 12

METHOD AND APPARATUS FOR INCREASED EFFECTIVENESS OF DELAY AND TRANSITION FAULT TESTING

BACKGROUND

1. Field of the Invention

The embodiments of the invention generally relate to testing, and more specifically, to increasing the effectiveness of delay and transition fault testing.

2. Description of the Related Art

Conventional scan based delay and transition fault testing methods combine multiple domains together using the limited number of test clocks entering the design. Therefore these conventional scan based delay and transition fault testing methods have limited resolution and consequently require low test clock skew over disparate domains and/or over large regions of the same domain.

At speed structural testing is a recent advancement in the ability to perform delay testing of integrated circuits. At speed structural testing exploits the functional clocks in the design, and can therefore run testing at the functional speed of the circuit design. This provides an advantage over scan based delay and transition fault testing. However, at speed structural testing does not provide complete test coverage and has a limited ability to cover cross-clock-domain paths. Therefore, conventional scan based delay and transition fault testing can still be required to augment at speed structural testing. In this application the term "domain" is interpreted broadly and comprises, digital logic, memory array, analog, and mixed-signal domains which may combine digital and analog.

Conventional delay and transition fault testing has the ability to identify defects or faults missed by at speed structural testing and similar tests. Moreover, the defects or faults missed by at speed structural testing tend to be in the longer more complicated paths where the delay variation is averaged over many elements. Delay and transition fault testing is most effective on long timing paths, where the inaccuracy is a smaller percentage of the domain's cycle time.

In circuits implemented with Application Specific Integrated Circuits (ASICs), Field Programmable Gate Arrays (FPGAs), custom logic, and microprocessors, the circuits may be functional at slower frequencies. However, timing defects in these circuits may cause the design not to work at the designed operating frequency.

These defects make this broad universe of electronic devices susceptible to failure at high clock frequency where circuit paths tend to have less margin or tolerance. As fabrication and other process improvements further reduce operational cycle times, even smaller defects must be identified to ensure implemented circuits operate properly.

For example, conventional FPGA delay testing places built-in self-test structures at various locations around the chip. Each built-in self-test structure contains a test pattern generator that applies test vectors to paths, and an output response analyzer that detects faults in those paths. Conventional built-in self-test techniques access internal paths unreachable by external test equipment. However, the accuracy of conventional built-in self-test techniques are insufficient for designs with small timing margins. These problems arise with a broad universe of electronic devices.

For example, the techniques described in Chmelar's paper ("FPGA Interconnect Delay Fault Testing," in *Proc. IEEE Int'l Test Conf.*, Vol. 1, pp. 1239-247, 2003) detected faults as small as 360 pico seconds (ps). However, as operating frequencies continue to increase, there is a need to be capable of detecting even smaller timing defects in FPGA and a broad universe of electronic devices.

SUMMARY

In view of the foregoing, disclosed herein are methods and apparatus for increased effectiveness of delay and transition fault testing. In one exemplary embodiment according to the invention, the method of delay fault testing integrated circuits comprises the steps of creating a plurality of test clock gating groups. The plurality of test clock gating groups comprise elements defining signal paths between components within the integrated circuit. Each of the elements of the plurality of test clock gating groups share clock frequency and additional shared characteristics. At least one test signal is commonly and selectively connected through at least one low-speed gate transistor to each of the elements comprising each of the plurality of test clock gating groups based on membership in the test clock gating group.

In a second exemplary embodiment, the method of delay fault testing of integrated circuits comprises creating a plurality of scan-enable gating groups. The plurality of scan-enable gating groups comprise elements defining signal paths between components within the integrated circuit. Each of the elements of the plurality of scan-enable gating groups share clock frequency and additional shared characteristics. At least one test signal is commonly and selectively connected through at least one low-speed gate transistor to the elements comprising the plurality of scan-enable gating groups using low-speed gating and based on membership in the scan-enable gating group.

In a third exemplary embodiment, an integrated circuit with built-in self test structures comprises low speed gates for commonly and selectively gating at least one test signal to elements comprising a plurality of scan-enable or test clock gating groups. The scan-enable or test clock gating groups comprised of elements defining inter-element signal paths and sharing clock frequency and additional characteristics.

In a fourth exemplary embodiment, a program storage device readable by machine tangibly embodies a program of instructions executable by the machine for performing a method of delay fault testing of integrated circuits. The tangibly embodied program of instructions comprises the steps of creating a plurality of test clock or scan-enable gating groups. The plurality of test clock or scan-enable gating groups comprises elements defining signal paths between components within the integrated circuit. Each of the elements of the plurality of test clock or scan-enable gating groups shares clock frequency and additional shared characteristics. At least one test signal is commonly and selectively connected through at least one low-speed gate transistor to each of the elements comprising each of the plurality of test clock or scan-enable gating groups based on membership in the test clock or scan-enable gating group.

BRIEF DESCRIPTION OF THE DRAWINGS

The embodiments of the invention will be better understood from the following detailed description with reference to the drawings, which are not necessarily drawn to scale and in which:

FIG. 11 shows an exemplary data structure 1900 for group assignments according to an aspect of this invention;

FIG. 12 shows an exemplary set of tests for parallel execution according to an aspect of this invention;

DETAILED DESCRIPTION

Figure 1:
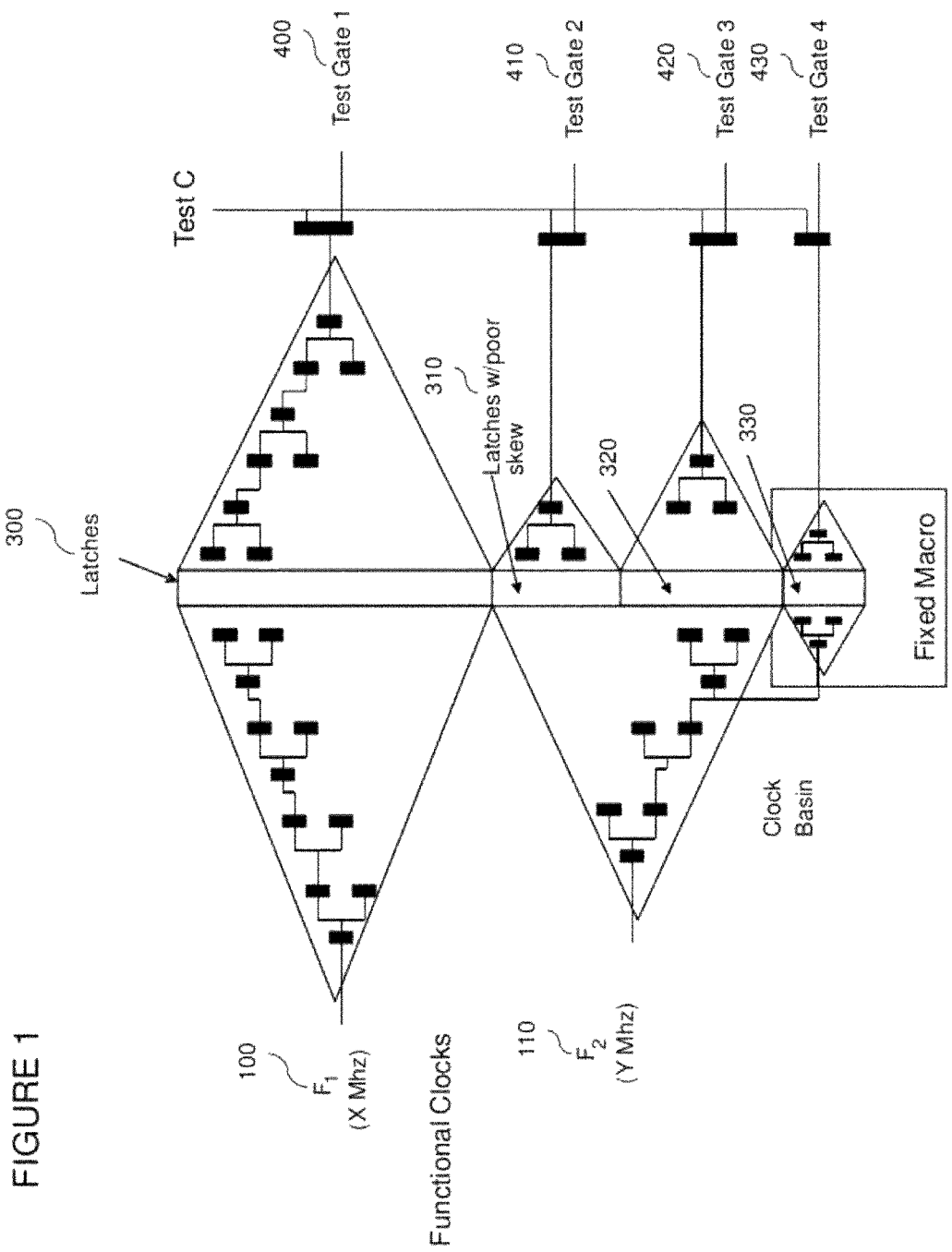
FIG. 1 is an exemplary clock design diagram according to an aspect of this invention.

The embodiments of the invention and the various features and advantageous details thereof are explained more fully with reference to the non-limiting embodiments that are illustrated in the accompanying drawings and detailed in the following description.

As mentioned above, there remains a need for delay and transition fault testing that is less sensitive to test clock skew over disparate domains and/or large regions of the same domain and for delay fault testing that is capable of detecting ever smaller timing margin defects in FPGA and a broad universe of electronic devices.

The various exemplary embodiments of test structures according to this invention comprise evaluating functional clock domains of a design. This may include looking at the frequencies of the functional domains and various regions of the design within the clock domain that share characteristics. The shared characteristics may include common pre-designed cores or elements, cross-domain paths and timing constraints as well as the latencies from input clocks to latching elements.

The design is then separated into test gating groups based on the frequency and identified shared characteristics. For example, in various exemplary embodiments, similar frequency domains are combined in a single test gating group.

The test gating group may be defined by ability to meet test clock skew targets. This can result in either splitting a single domain or splitting similar frequency domains based on clock tree similarity.

Low speed test gates are then inserted into the design to independently control the test clocks to each test gating group. This includes independent gating control of launch and capture clocks to enable various combinations of domain to domain delay and transition fault testing.

The test clocks are tightly balanced within each group from the test clock primary input to the latch, including any latency in the latch element, or latency to get to the latch within a macro, or core. The balancing should be with respect to latch capture time for "C" type clocks, and latch launch for "B" type clocks. However, latency from the primary input to latch does not need to be matched across groups. This reduces design complexity and cost resulting in faster time-to-market.

In various exemplary embodiments according to this invention, elements that are the same substance as the clock tree are used for latency padding. The use of the same substance for the latency padding enhances tracking over parameter changes.

Testing on a domain by domain basis is executed sequentially, or executed on multiple domains in parallel. This is accomplished by controlling launch and captures to and from each domain, via independent domain launch and capture clock gating controls. In various exemplary embodiments according to this invention, the use of lower cost manufacturing test equipment is facilitated by using clock gating applied at slow speeds, independent of the delay test launch to capture timed interval.

For FPGA cores within a clock domain, a built-in self test structure is used to perform path delay testing on included FPGA portions. An on-chip programmable delay line is used to set the launch time of each test pattern generator to its optimum point for stressing paths in the routed chip. The rising and falling edges of each pattern (tbus in FIG. 6) are controllable with high precision. This ensures that very small timing faults that exist in the path-under-test are detected. Furthermore, the built-in self test structures can test multiple paths simultaneously to reduce the overall test time.

Various exemplary embodiments of the built-in self test structures according to this invention can be used on FPGA devices containing run-time adjustable delay lines. Moreover, the built-in self test structures incur no additional area overhead since the delay line and test pattern generator are already included in the FPGA fabric.

FIG. 1 is an exemplary clock design diagram according to an aspect of this invention. A first clock domain $F_1$ 100, operating at a first frequency and first set of latches 300 are selectively enabled by exemplary test gate 1 400. A second clock domain $F_2$ 110, operating at a second frequency is associated with latches having various characteristics. For example, in one exemplary embodiment according to this invention, a set of latches associated with poor skew 310 are selectively and commonly enabled by test gate 2 410. That is, the $F_2$ 110 clock domain is split into sub-portions or groups. One sub-portion is associated with latches with poor skew 310. Testing of this sub-portion or group of the clock domain is enabled by low-speed test gate 2 410. An additional set of latches having a common latency 320 within the $F_2$ 110 clock domain are selectively enabled for testing by low-speed test gate 420.

Fixed macro 330 is selectively enabled by low-speed test gate 430. Fixed macros are useful in padding circuit elements to ensure and/or create sets of circuit elements having similar characteristics.

Figure 2:
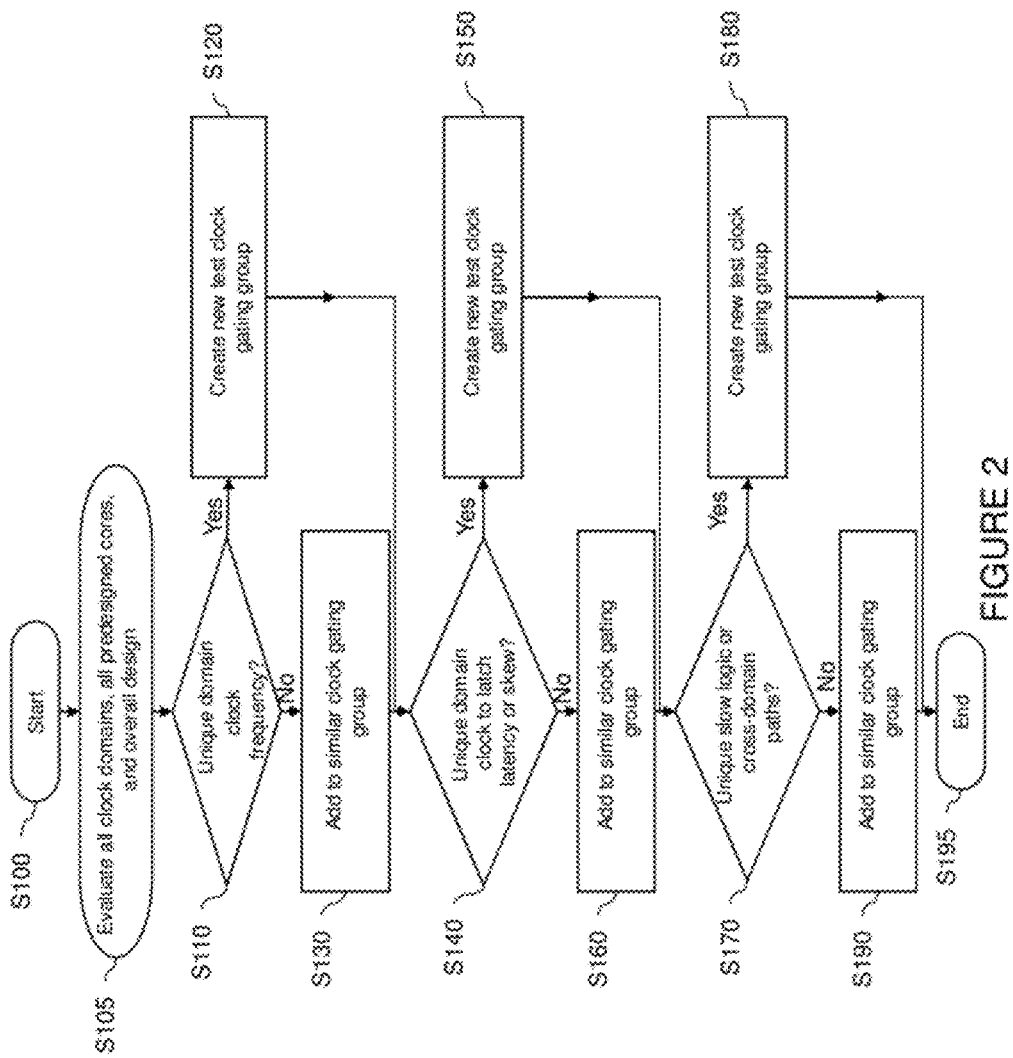
FIG. 2 is an exemplary method of creating test clock gating design groups according to an aspect of this invention.

FIG. 2 is an exemplary method of creating test clock gating design groups according to an aspect of this invention. The process begins at step S100 and immediately continues to step S105. In step S105, the overall design is analyzed. The analysis includes a review of the unique clock domains, the latency and skew associated with the latches, the paths between clock domains and other characteristics capable of inducing timing incompatibilities. After the design has been analyzed, control continues to step S110.

In step S110, a determination is made as to whether unique clock domains exist. If a unique clock domain is identified, control jumps to step S120 where a new gating group is created for the unique clock domain. After the clock gating groups has been created for the unique clock domain, control continues to step S140.

Otherwise, if it is determined in step S110 that the clock domain is not unique, control continues to step S130 and the clock domain is added to the closest or most similar clock gating group. In this way, clocks sharing similar characteristics are selectively and commonly enabled based on their respective clock gating group. After the clock domain has been added to a similar clock gating group, control continues to step S140.

In step S140, a determination is made as to whether unique domain clock to latch latency and/or skew characteristics are present within the clock domain. If unique domain clock to latch latency or skew characteristics are identified, control continues to step S150 where the relevant circuit elements are associated with a new test clock gating group. Control then continues to step S170.

Otherwise, if it is determined in step S140 that the domain clock to latch latency or skew is not unique, the circuit elements are added to the most similar test clock gating group based on the shared similar characteristics. Thus, in one exemplary embodiment according to this invention, circuit elements with similar domain clock to latch latency are added to the same test clock gating group. Similarly, circuit elements with similar domain clock to latch skew may also be added to the unique test clock gating group based on a similarity threshold. After the circuit elements have been added to a similar clock gating group, control continues to step S170.

A determination is made as to whether a unique slow logic or cross-domain path between circuit elements exists in step S170. By isolating slow logic into a common clock gating group, the effects of mixing the slow and fast logic and/or the effects of the cross-domain path is avoided. In various other exemplary embodiments according to this invention, different cores, subsets of circuits or other disparate entities are similarly isolated into unique test clock gating groups. Thus, in one exemplary embodiment, one or more FPGA components are assigned to a unique test clock gating group. This provides for further customizing the delay fault and transition testing for specific fabrication technologies, particular cores or other subsets of circuits sharing similar characteristics.

If it is determined that a unique slow-logic or cross-domain path exists, control continues to step S180 and a unique test clock gating group is created. The circuit elements are added to the test clock gating group and control continues to step S195 where the process ends.

Otherwise, if it is determined that no unique slow logic or cross domain paths exist, control continues to step S190. The circuit element is then added to the most similar test clock gating group. Control then continues to step S195 where the process ends. In various exemplary embodiments according to this invention, low-speed gating circuits associated with each test clock gating group are inserted into the design as each new test clock gating group is created. However, it will be apparent that various other methods of inserting gating circuits for each test clock gating group may also be used without departing from the spirit or scope of this invention.

Figure 3:
FIG. 3 is an exemplary method of creating mux-scan enabling gating groups according to an aspect of this invention.

FIG. 3 is an exemplary method of creating mux-scan enabling gating groups according to an aspect of this invention. Control begins at step S200 and immediately continues to step S205. In step S205 the clock domains, the pre-designed cores and the overall design are evaluated. The evaluation determines portions of circuit elements within unique clock domains that share similar characteristics. In various exemplary embodiments according to this invention, the similar characteristics include forming all or part of the device using a pre-designed core. Sharing similar characteristics may include shared implementation technologies or techniques, shared overall design characteristics, such as common FPGA implementation or the like. After the evaluation of the clock domains, pre-designed cores and overall design is complete, control continues to step S210 where each clock domain is examined.

If it is determined in step S210 that the clock domain is unique, control continues to step S220 where a new scan enable gating group is created. In various exemplary embodiments according to this invention, creating a new scan enable gating group may be associated with inserting low speed scan enable gating circuitry into the overall design or device implementation. After the new scan enable gating group has been determined, control continues to step S240.

Otherwise, if it is determined in step S210 that the frequency of the selected clock domain is not unique, control continues to step S230. The clock domain is then added to a similar scan enable gating group based on the shared frequency characteristic of the clock. Control then continues to step S240.

In step S240, circuit paths in the clock domain sharing unique flip-flop latency and/or skew are determined. Thus, in one exemplary embodiment, circuit paths terminating and/or originating at a flip-flop within one clock cycle are identified as a new scan enable gating group. Scan enable gating groups are groups of elements in the circuit design and/or implemented circuit for which discrete scan enable gating circuits are inserted into the circuit design and/or implemented in the device.

If it is determined in step S240 that sub-portions of the circuit elements within the clock domain form unique sub-portions of the circuit sharing similar domain scan-enable latency or skew, control continues to step S250 where a new scan enable group is created. For example, in one exemplary embodiment of this invention, creating a new scan enable gating group inserts low-speed scan enable gating circuits into the design. The low speed scan enable gating circuits enable selective testing of the specified sub-portions of the clock domain that share the identified flip-flop latency and/or skew characteristics. Thus, hardware testing of devices implemented using the design include the specified low-speed scan enable gating circuits necessary for the hardware test of these sub-portions of circuit elements within the clock domain. Control then continues to step S270.

Otherwise, control continues to step S260 where the identified circuit elements are added to a scan enable gating group with circuit elements in the clock domain that share similar flip-flop latency and/or skew characteristics. After adding the circuit elements to the scan enable group, control continues to step S270.

In step S270, unique slow-logic and/or cross-domain paths are determined. Combining unique slow-logic and/or unique cross domain paths would mask some errors due to the averaging of the errors with other faster circuit elements and/or inter-domain paths. Thus, a new scan enable gating group is created for each unique slow-logic and/or cross-domain path, in step S280. Control then jumps to step S295 where the process ends.

Otherwise, if it is determined in step S270 that the slow-logic and/or circuit elements involved in the cross-domain paths would not benefit from a separate scan enable gating group, control continues to step S290.

In step S290, the slow-logic circuit elements and/or circuit elements associated with non-unique cross-domain paths are added to a scan enable gating group with which they share similar characteristics. After adding the slow-logic elements or paths to the group, control continues to step S295 and the process ends. It will be apparent that the design and/or hardware include the test clock gating or scan-enable gating circuits.

Figure 4:
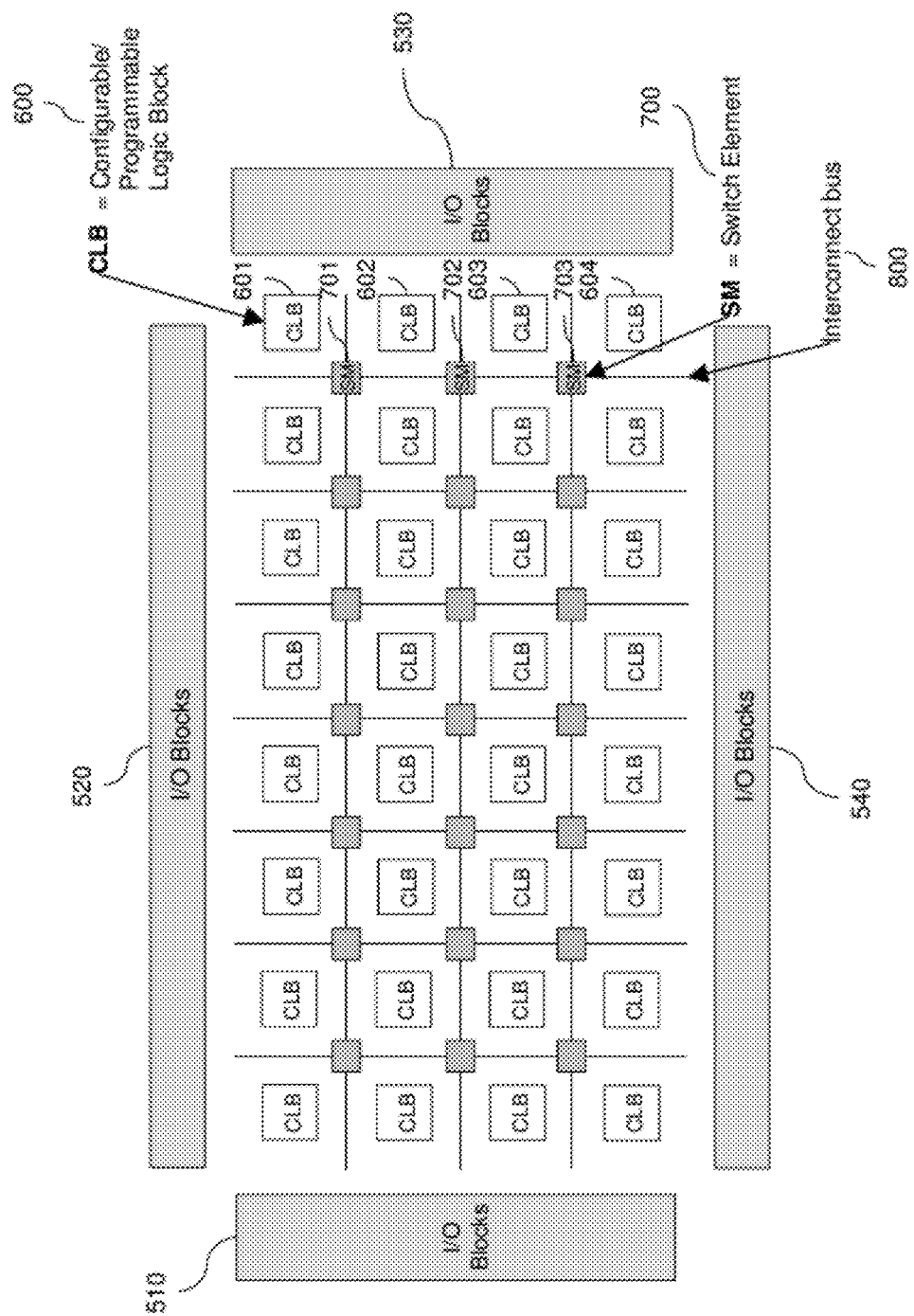
FIG. 4 is an exemplary block diagram of a Field Programmable Gate Array.

FIG. 4 is an exemplary block diagram of a Field Programmable Gate Array (FPGA) device 600. The FPGA is comprised of configurable or programmable logic blocks 601, 602, 603, and 604 each inter-connected by programmable switch elements 701, 702, 703 over an inter-connect bus 800. The interconnect also connects I/O blocks 510, 520, 530 and 540 to the device fabric. The programmable switch elements 701, 702, 703 are programmed to selectively inter-connect the configurable/programmable logic blocks 601, 602, 603, and 604.

Figure 5:
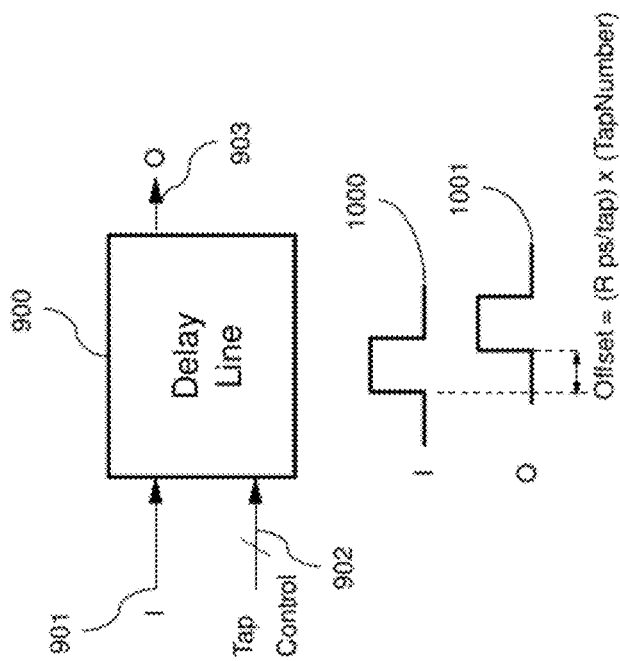
FIG. 5 is an exemplary test element used in the programmable built-in self-test structure according to an aspect of this invention.

FIG. 5 is an exemplary test element used in the programmable built-in self-test structure according to an aspect of this invention. A programmable delay line 900 comprises an input line I 901 and a tap control line 902. In one exemplary embodiment, the programmable delay line is a XILINX® Virtex-4 device with 64 taps, where each tap provides a 78 pico second offset that can be selected to control the delay from pin I 901 to pin O 903. However, it should be apparent that various other programmable delay lines can also be used without departing from the spirit or scope of this invention. In one exemplary embodiment, the programmable built-in self-test structure affords different offsets by selecting different taps on the programmable delay line. It will be apparent that exemplary embodiments of this invention directed to delay testing may be applied to discrete FPGA devices as well as FPGA cores without departing from the spirit or scope of the invention.

Figure 6:
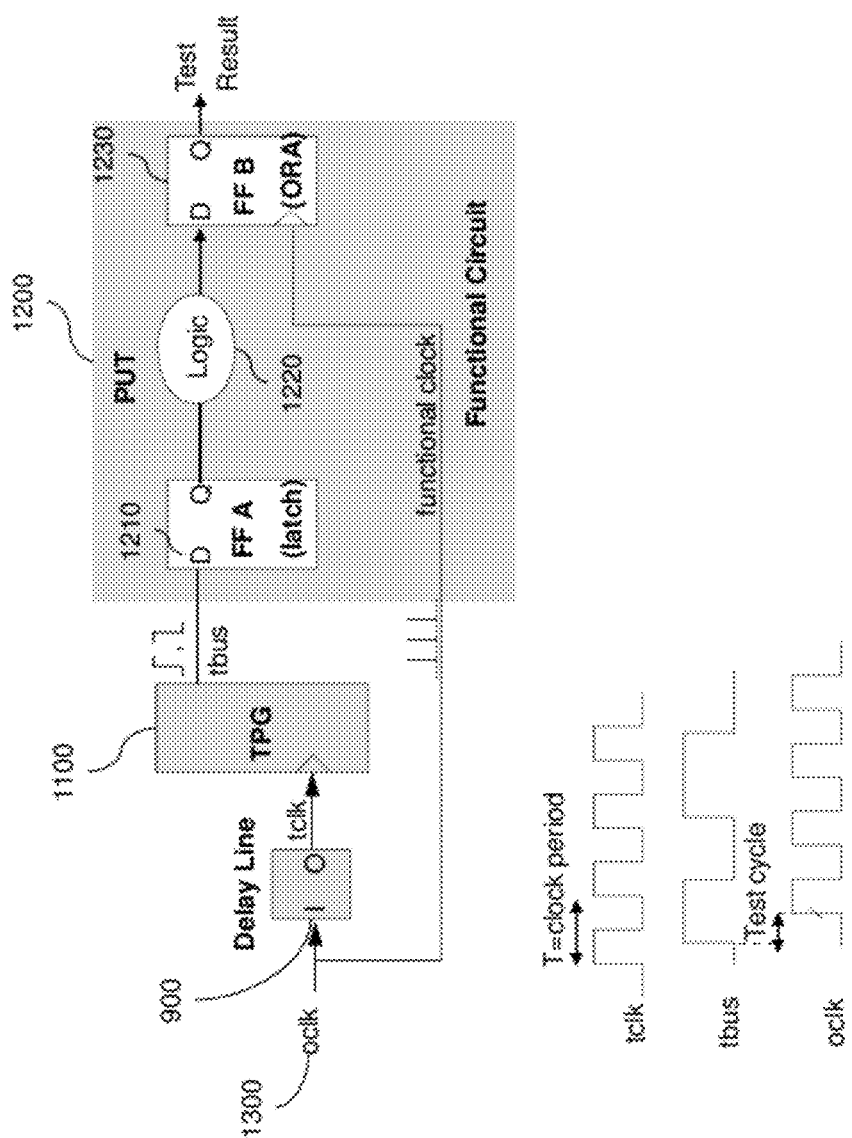
FIG. 6 is an exemplary single path programmable built-in self-test architecture according to an aspect of this invention.

FIG. 6 is an exemplary single path programmable built-in self-test architecture according to an aspect of this invention. The path begins at flip-flop A 1210, follows through the logic 1220, and ends at flip-flop B 1230. In order to test this path, a delay line 900 (as one exemplary configuration shown in FIG. 5) and one test pattern generator 1100 are inserted into the register transfer level (RTL) behavioral description along with the functional circuit 1200. The delay line 900 and test pattern generator 1100 comprise the test logic that identifies delay faults in the logic path under test 1220. The delay line 900 receives the same clock (oclk) used by the functional circuit 1200 and produces a delayed clock (tclk) that drives the test pattern generator 1100. Therefore, incrementing the delay line by one tap causes the rising and falling edges of the test pattern generator 1100 output (tbus) to shift by one tap.

Initially, the test pattern generator 1100 output connects to a dummy load so the test logic is completely isolated from the functional circuit 1200 and will not interfere with normal operation. Next, the circuit design is synthesized, placed, and routed using standard FPGA tools. The last step is to reconfigure the FPGA to attach the test pattern generator 1100 output to the logic 1220 path under test. The test pattern is sensitized all the way to flip-flop or output result analyzer B 1230. This is accomplished using standard FPGA tools or other means to wire tbus to the D pin on flip-flop A 1210, reprogram flip-flop A 1210 as a transparent latch, and program the combinational logic (lookup tables and muxes) to direct the pattern to flip-flop B 1230. After this reconfiguration is performed, the path is tested by pulsing oclk two times. The first pulse launches the test pattern onto the path under test and the second pulse captures it in the output result analyzer/flip-flop B 1230.

Prior to executing tests in hardware, a simulation is run after the routing in the design has been completed. The simulation determines the tap number that passes with a small amount of data setup margin at the output result analyzer flip-flop B 1230. For example, in one exemplary embodiment according to this invention, a script is executed in a simulator such as ModelSim. The script simulates incrementing the tap until a timing violation occurs. It will be apparent that in various other exemplary embodiments other model simulators may be used without departing from the spirit or scope of this invention.

Once the proper tap setting is determined, the FPGA hardware is tested by pulsing the clock in that tap setting. The value of the output result analyzer flip-flop B 1230 is checked by scanning it out or using another technique to compare it to the expected value. If the value is incorrect then the path under test has a delay fault.

It will be apparent that no changes are made to the functional circuit 1200 except to sensitize the test pattern through the path under test to the output result analyzer flip-flop B 1230. That is, no routing changes are needed to the path under test. Thus, the built-in self-test structures check the routing of the functional circuit 1200.

The resolution of faults caught by the built-in self test structures is equal to the spacing between two consecutive taps of the delay line. For example, the IDELAY delay line on Xilinx Virtex-4 has 78 ps between taps, therefore delay faults down to 78 ps can be detected using our test method on the XILINX Virtex-4 product.

Figure 7:
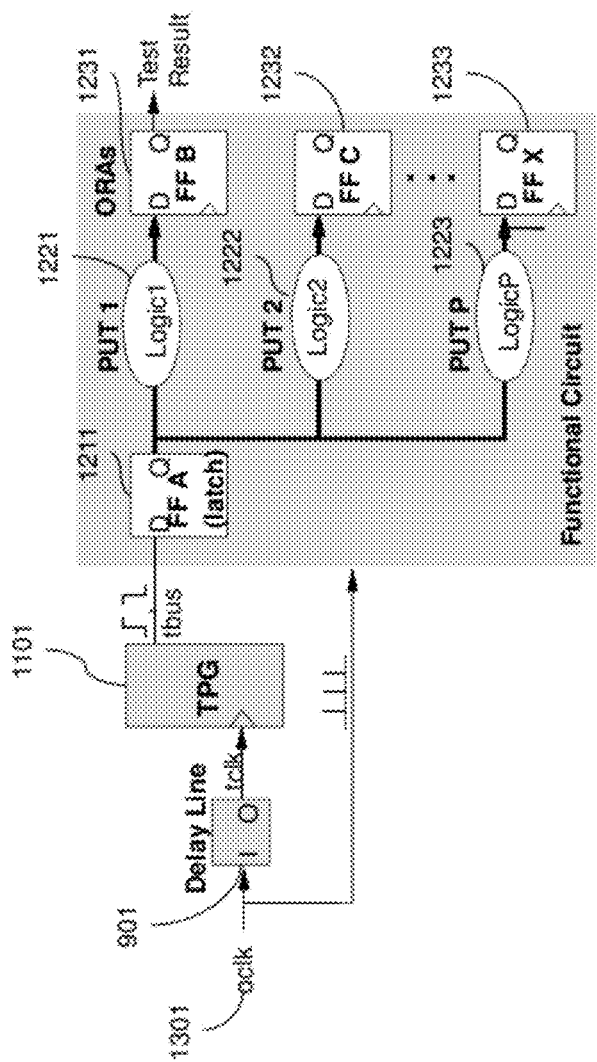
FIG. 7 is an exemplary programmable multi-path built-in self-test architecture according to an aspect of this invention.

FIG. 7 is an exemplary programmable multi-path built-in self-test architecture according to an aspect of this invention. The exemplary architecture shows multiple paths being tested in parallel. For example, flip-flop A 1211 drives the test pattern to P different paths at the same time. Each of the output result analyzer flip-flops B 1231, C 1232 and X 1233, at the end of the paths 1-P 1221-1223 capture the patterns at the next rising edge of the clock.

Figure 8:
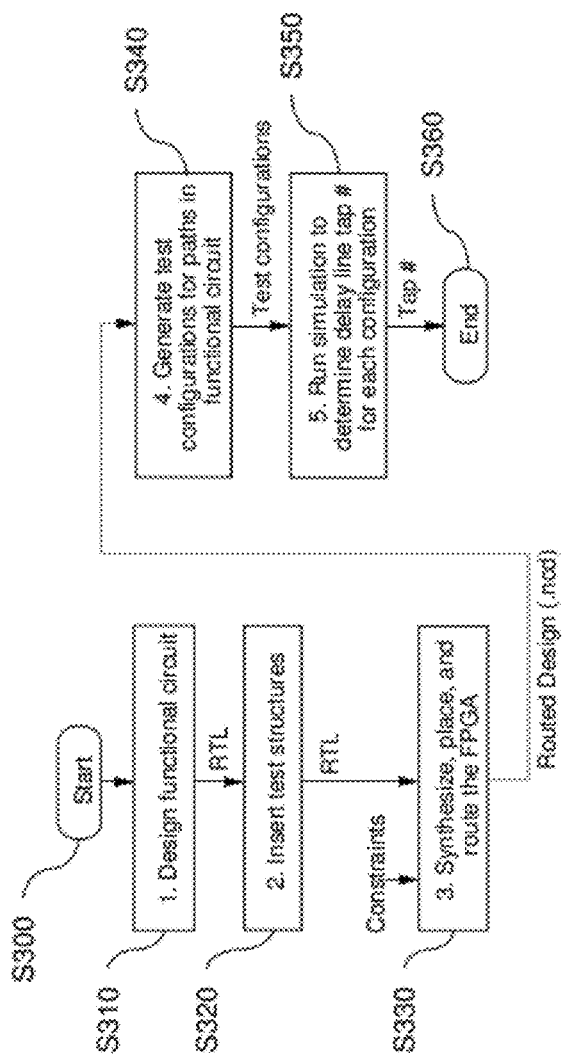
FIG. 8 is an exemplary method of programmable built-in self testing according to an aspect of this invention.

FIG. 8 is an exemplary method of programmable built-in self testing according to an aspect of this invention. The process begins at step S300 and immediately continues to step S310 where the functional circuit is designed. The functional circuit may be designed using various electronic design automation tools and/or circuits descriptions without departing from the spirit or scope of this invention.

After the design is complete, control continues to step S320 where the test structures (Delay Line and Test Pattern Generators) are inserted into the design. Typically this is done by coding them in RTL along with the functional design. —However, it should be apparent that various methods of inserting test structures may be used in the practice of this invention. After the circuit has been designed and the test structures inserted, control continues to step S330.

In step S330, the design is synthesized, placed and routed to the target FPGA device. It will be apparent that various other technologies such as ASICs may also be used without departing from the spirit or scope of this invention. For example, this step may be used to identify constraints on the placement of elements within a target FPGA device that must be enforced to correctly model the device in use. After the design has been synthesized, placed and routed, control continues to step S340.

In step S340, test configurations are generated for identified paths between elements in the FPGA model. A set of test configurations for these paths is then generated. After the test configurations have been generated, control continues to step S350.

In step S350 simulations are run to determine the appropriate delay needed on the programmable built-in self-test structure. In one exemplary embodiment, appropriate tap numbers on the programmable delay line are selected based on the delay identified for the path under test. Simulations of the circuit under test monotonically increase the timing delay by selecting consecutively higher tap numbers until a failure is detected by the simulated output result analyzer. A back-off process is then engaged to select the tap number associated with the last successful cycle before the simulated delay error occurred. The resultant programmable delay or tap number is then output.

It will be apparent that in various other exemplary embodiments, multiple inter-element paths sharing similar characteristics may be simultaneously tested. After the appropriate programmable delay has been determined, control continues to step S360 and the value is returned and the process ends. The returned tap number is then programmed into the Delay Line circuit in order to test the FPGA hardware for delay defects.

Figure 9:
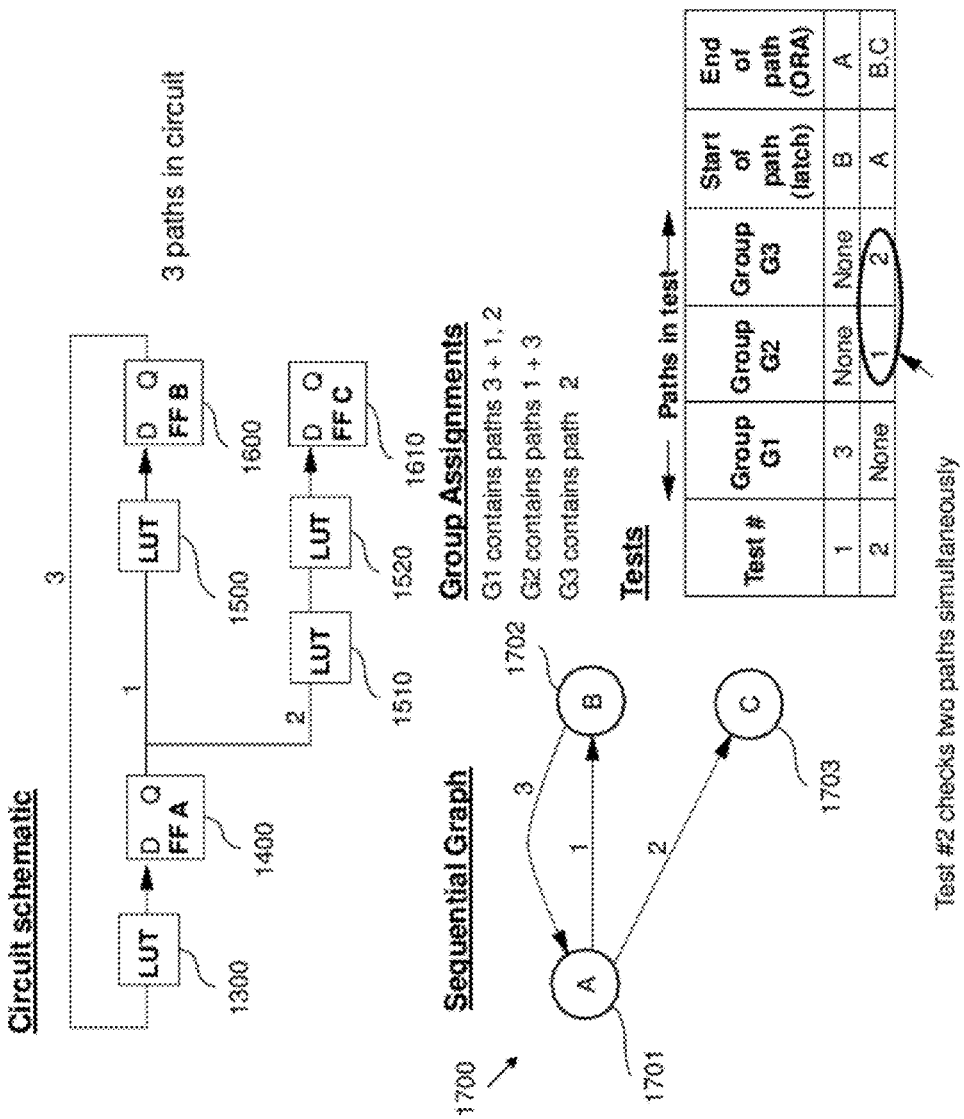
FIG. 9 is an exemplary programmable built-in self-test circuit architecture and graph grouping parallel paths according to an aspect of this invention.

FIG. 9 is an exemplary programmable built-in self-test circuit architecture and graph grouping parallel paths according to an aspect of this invention. A circuit under test comprises 3 paths. A grouping technique identifies paths in the circuit using a sequential graph. The technique defines a group as any path that terminates at a given flip-flop circuit element in the design, plus any paths that start at the identified flip/flop in the following clock cycle.

Paths from different groups form a set of candidates for parallel testing. A set of tests is then identified by selecting one path from each independent group of paths. For example, applying these constraints yields group G1 containing paths 3, 1, and 2, where path 3 terminates at flip-flop A, while paths 1 and 2 begin at flip-flop A. This is designated by the notation 3+1,2. Group G2 contains paths 1+3 and group G3 contains path 2. Further analysis identifies groups G2 and G3 as parallel test candidates. Path 3 from group 1 is selected as the first test. Paths 1 and 2 are selected from groups G2 and G3 respectively as the second test configuration. This path grouping method provides complete test coverage with a small number of FPGA configurations, therefore it is more efficient than testing only one path at a time.

Figure 10:
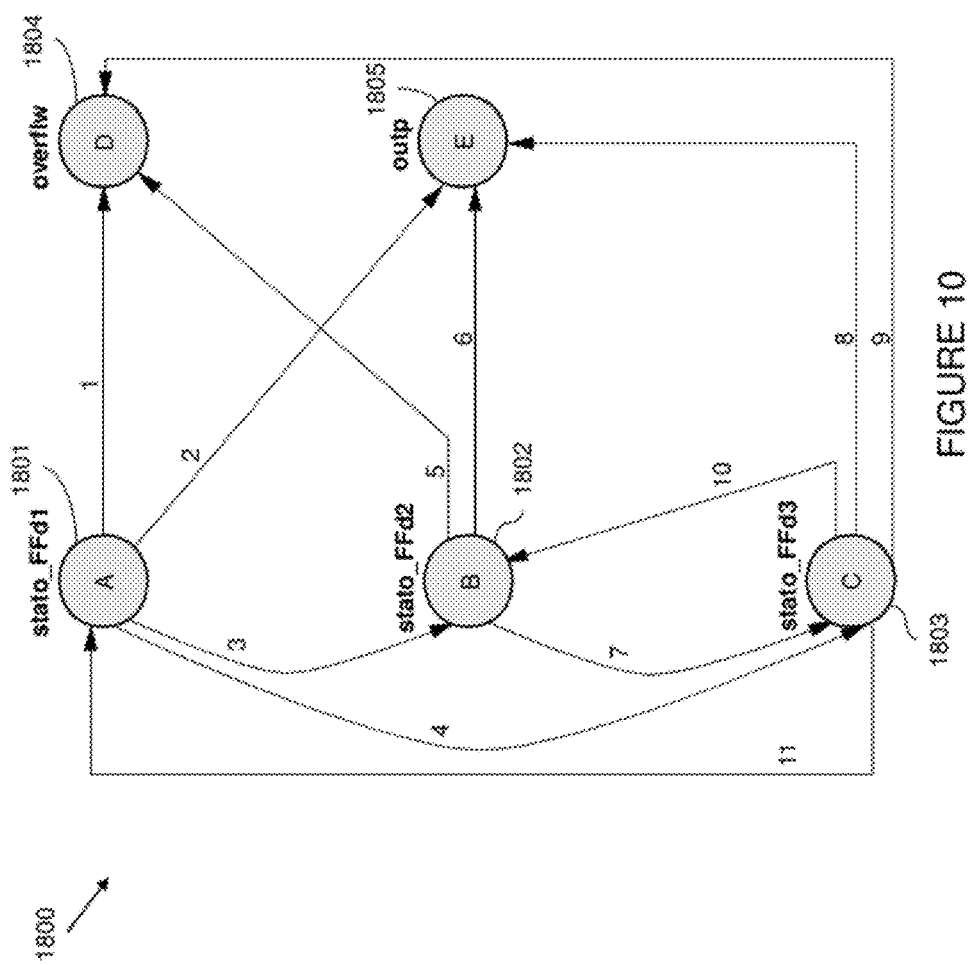
FIG. 10 shows an exemplary graph illustrating 11 paths to be tested.

FIG. 10 shows an exemplary graph illustrating eleven paths to be tested. Node A 1801 is connected over outgoing paths 1, 2, 3 and 4 to nodes B 1802, C 1803, D 1804 and E 1805. Node A 1801 is connected over incoming path 11 to node C 1803. Node B 1802 is connected over outgoing paths 5, 6 and 7 to nodes D 1804, E 1805 and C 1803. Incoming paths 3 and 10 connect nodes A 1801 and C 1803 to node B 1802. Node C 1803 is connected over outgoing paths 8, 9, 10 and 11 to nodes E 1805, D 1804, B 1802 and A 1801. Incoming paths 4 and 7 also connect nodes A 1801 and B 1802 to node C 1803. Node D 1804 is connected over incoming paths 1, 5 and 9 to nodes A 1801, B 1802 and C 1803. Finally, node E 1805 is connected over incoming paths 2, 6 and 8 to nodes A 1801, B 1802 and C 1803.

FIG. 11 shows an exemplary data structure 1900 for group assignments of the various paths in FIG. 10 according to an aspect of this invention. A group identifier portion 1910 contains group assignment indicators. The path portion 1920 contains a list of paths associated with the group identified by the group identifier. The node portion 1930 indicates the terminating or originating flip-flop or circuit element anchoring the path.

The first line contains the value "G1" in the group identifier portion 1910, the value "1,5,9" in the path portion 1920, and the value "D" in the node portion 1930. These values indicate that paths 1, 5 and 9 all terminate at node "D" and are commonly assigned to group "G1". Similarly, the values in row 2 indicate that incoming paths 2, 6 and 8 terminate at node E and are assigned to group "G2". The third row values indicate that incoming path 11 terminates at node A, while paths 1, 2, 3 and 4 originate from node A and are all assigned to group "G3". The values in the fourth row indicate paths 3 and 10 terminate at node B, while paths 5, 6 and 7 originate at node B and are assigned to group "G4". Finally, the values in row 5 indicate that paths 4, 7 terminate at node C, while paths 8, 9, 10 and 11 originate from node C and are all assigned to group "G5".

FIG. 12 shows an exemplary set of tests for checking multiple paths simultaneously, according to an aspect of this invention. A set of 3 test configurations are used to test the 11 paths in the circuit. For example, test configuration 1 tests paths 1, 2, 3 and 4 while test configuration 2 tests paths 5, 6 and 7. Finally test configuration 3 tests paths 8, 9, 10 and 11. This provides complete coverage of all paths in the circuit under test with only three test configurations.

Figure 13:
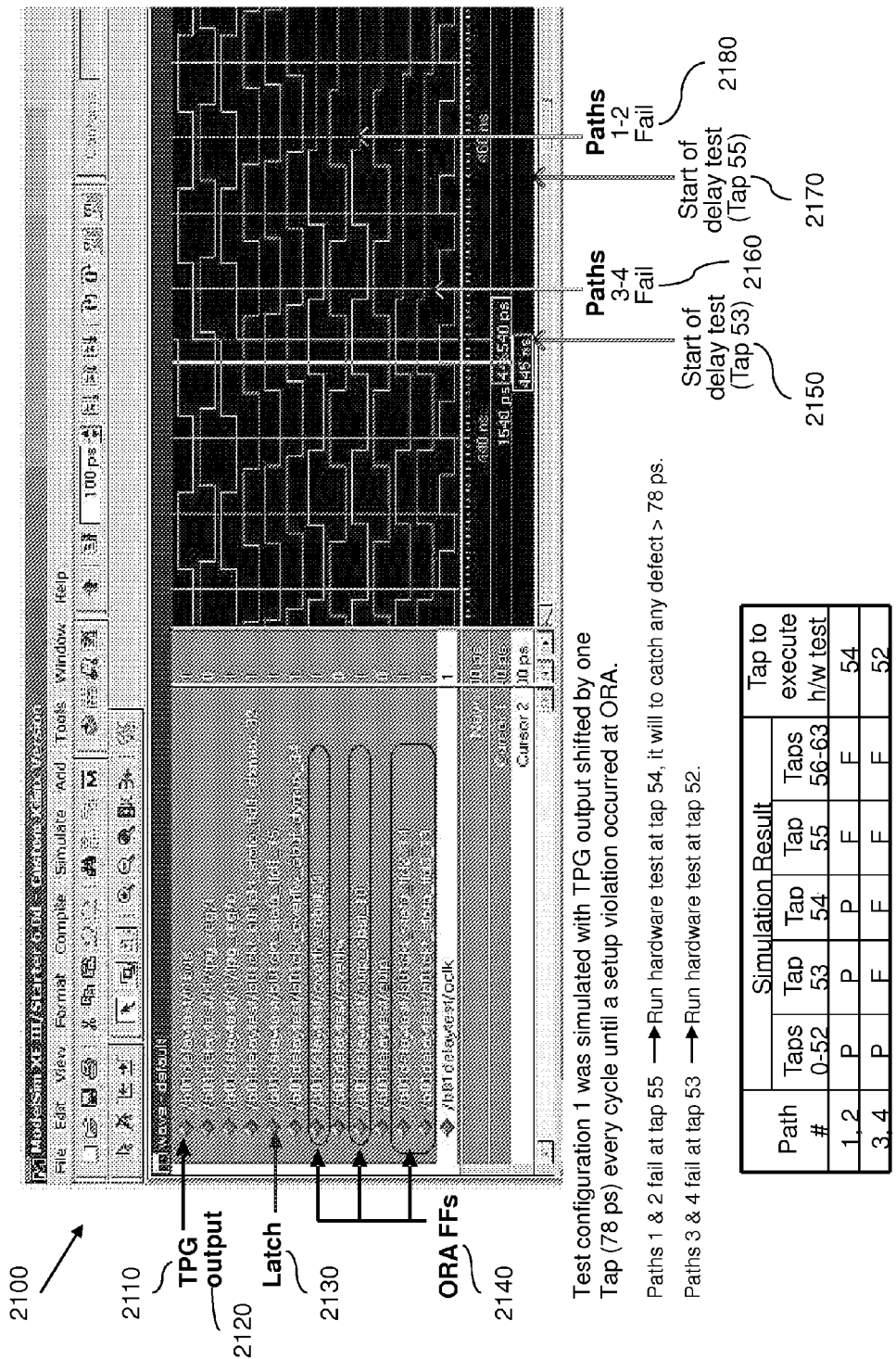
FIG. 13 shows an exemplary simulation result for a circuit under test according to an aspect of this invention.

FIG. 13 shows an exemplary simulation result for a circuit under test according to an aspect of this invention. At the top of the waveform, the test pattern generator drives rising and falling transitions and increments through the taps of the delay line. The pattern passes through the transparent latch and eventually arrives at the output result analyzer flip-flops. Three ovals 2140 enclose the four lines indicating the output result analyzer flip-flops in the ModelSim display as paths 1, 2, 3, and 4. At tap 53, the test pattern generator drives a falling pattern into the four paths. However, as indicated by the leftmost arrow below the waveform, the output result analyzers for paths 3-4 do not transition because the pattern arrived too late and violated the setup time requirement. Therefore, there is an indicator on the ModelSim display 2160 that paths 3-4 fail at this tap setting. The hardware should therefore be tested at tap 52 where it will pass if no defect exists. Similarly, an indicator 2180 on the ModelSim display indicates that paths 1-2 fail at tap 55 so those two paths should be tested at tap 54.

The first row of the simulation result table indicates the transition from P to F occurs at tap 55 indicating that tap 54 should be selected for paths 1, 2. The second row indicates the transition from pass to fail occurs at tap 53. Thus, tap 52 should be selected for the hardware testing of paths 3, 4.

Figure 14:
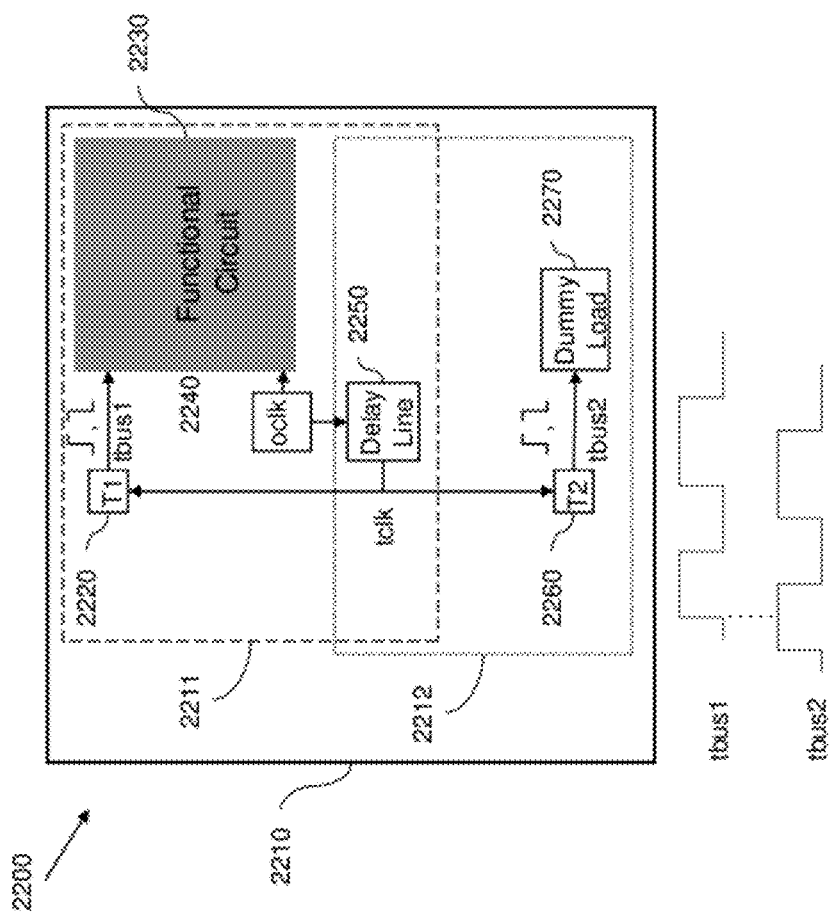
FIG. 14 shows an exemplary programmable built-in test structure comprising multiple test pattern generators implemented in a FPGA device according to an aspect of this invention.

FIG. 14 shows an exemplary programmable built-in test structure comprising multiple test pattern generators implemented in a FPGA device according to an aspect of this invention. The programmable built-in test structure is comprised of two test pattern generators 2220 and 2260 which share a common programmable delay line 2250 and an output result analyzer (not shown). The test pattern generator 2220 receives the clock signal and applies the test pattern to the circuit paths of the functional circuit 2230 under test. In another exemplary embodiment according to this invention, test pattern generator 2260 may be selected to drive the functional circuit 2240, while test pattern generator 2220 is unused. This allows extra ability to control the arrival time of the test pattern at the functional circuit 2240.

Test pattern generators can be placed proximate to the circuits under test to localize testing to the paths between the test pattern generator and the output result analyzer and eliminate effects of any potential propagation delays.

The second test pattern generator 2260 is connected to a dummy load 2270 since the two test pattern generators are not in the same test configuration group. However, it will be apparent that in various other embodiments according to this invention, parallel testing may be performed by enabling multiple test pattern generators simultaneously.

Figure 15:
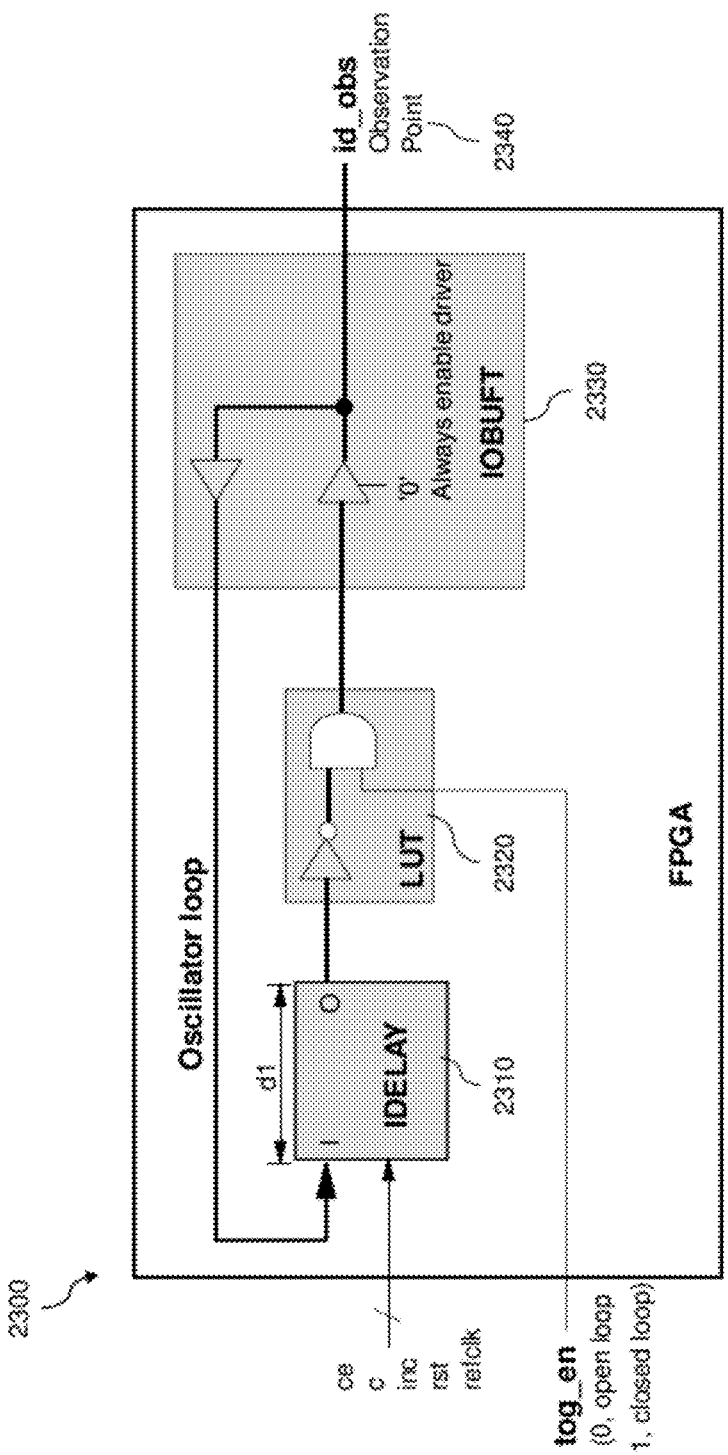
FIG. 15 shows the verification of an exemplary XILINX® FPGA based programmable built-in test structure according to an aspect of this invention.

FIG. 15 shows the verification of an exemplary XILINX® FPGA based programmable built-in test structure according to an aspect of this invention. The verification circuit checks the integrity of the elements comprising the built-in self test structures. This circuit drives a reference clock into delay line 2310 and observes the signal at the observation point 2340.

The tog_en input closes the loop which enables the circuit to oscillate. The oscillation frequency measured at observation point 2340 is a function of the tap setting selected in programmable delay circuit 2310. Therefore, the frequency of observation point 2340 can be predicted and compared with the measured value to verify that the programmable delay circuit 2310 is operating properly.

It will be apparent that the test gating described herein is applicable to all Level Sensitive Scan Design (LSSD) test clocks, but is also applicable to other test clocks. In addition, it can be used on edge-triggered mux-scan methodologies. A typical problem with this type of scan, is that in order to use the scanned-in values for the transition (known as launch-off-scan), the scan enable signal must be switched at speed. The scan enable is broadcast all over the chip, which is very difficult to achieve. This motivates the use of either a slower delay test or the use of an extra clock pulse (launch-off-capture). However, even with the extra pulse, the scan enable must switch predictably, which may require functional clock gating. The test generation is much harder with launch-off-capture, and the resulting test coverage's are lower than with launch-off-scan.

Various embodiments according to this invention allow the launch-off-scan by gating parts of the scan enable tree (rather than the test clock), with test gates and then carefully timing just subsets of the scan enable tree. This has a similar effect to the gating of a test clock. With the scan enable in the scan state, those flip-flops will not get a transition and thus will not participate in the delay test until any test steps with their gate at the enabling value.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 16:
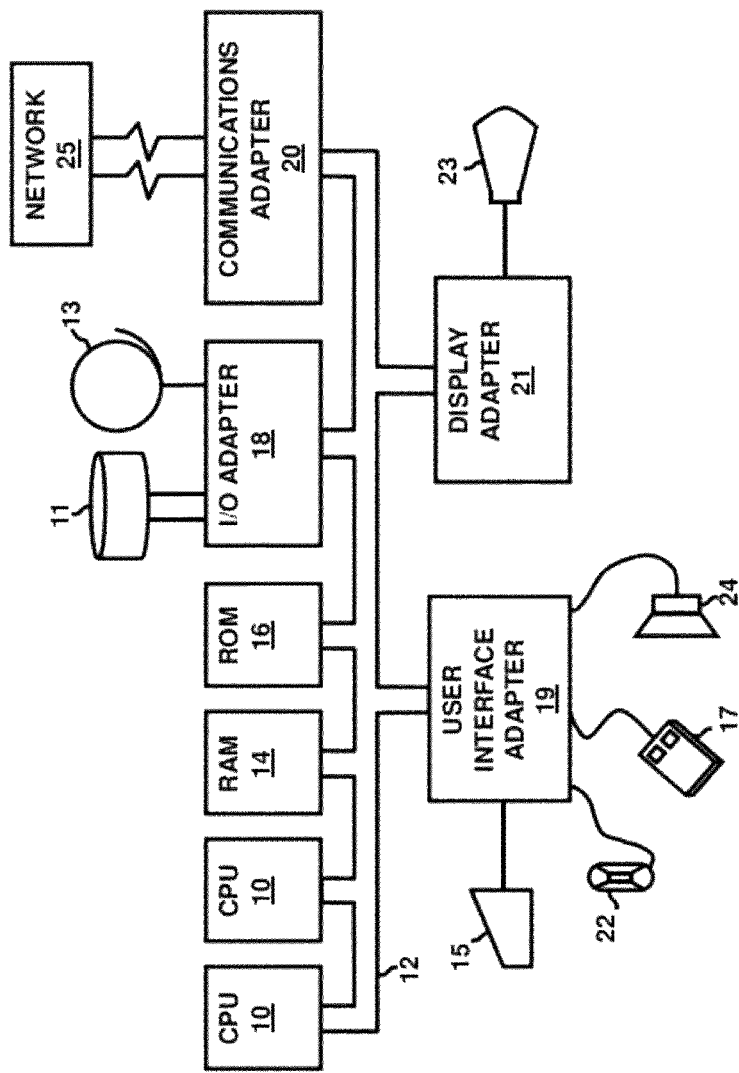
FIG. 16 is a schematic diagram illustrating an exemplary hardware environment that can be used to implement the embodiments of the invention.

FIG. 16 is a schematic diagram illustrating an exemplary hardware environment that can be used to implement various aspects and/or embodiments of this invention. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

The invention claimed is:

1. A method of delay fault testing an integrated circuit comprising:
   creating a plurality of test clock gating groups, said plurality of test clock gating groups comprising elements defining signal paths between components within said integrated circuit, each of said elements of said plurality of test clock gating groups sharing clock frequency and at least one additional shared characteristic; and
   selectively connecting at least one test signal through at least one low-speed gate transistor to each of said elements comprising said plurality of test clock gating groups based on membership in said test clock gating group, all members of each test clock gating group being connected to a common test signal.

2. The method of claim 1, said at least one additional shared characteristic comprising at least one of: latency, skew and cross-domain signal paths.

3. The method of claim 1, at least one of said elements of said integrated circuit being based on a plurality of pre-designed cores and said connecting of at least one test signal to at least one of said plurality of pre-designed cores being enabled with a single gate.

4. The method of claim 1, at least two of said elements being slow logic elements selectively enabled by a single gate.

5. The method of claim 1, at least two of said elements being multi-cycle elements selectively enabled by a single gate.

6. The method of claim 1, further comprising:
   programming an on-chip programmable delay line for a launch time of at least one pattern generator, said launch time being based on a simulation of delays in said signal paths and a tap selection of said on-chip programmable delay line;
   generating a test pattern based on said launch time; and
   indicating a result of a comparison between a test pattern received over said signal path to said test pattern generated based on said launch time.

7. The method of claim 6, at least one of said plurality of pre-designed cores being implemented using field programmable gate arrays.

8. The method of claim 6, further comprising verifying proper functioning of said programmable delay line based on the further steps of:
   forming an oscillator loop with an output;
   programming said on-chip delay line based on a second tap setting;
   measuring an oscillating frequency at said output of said oscillator loop;
   identifying an expected oscillating frequency based on said tap setting;
   comparing said oscillating frequency measured at said output of said oscillator loop to said expected oscillating frequency;
   indicating a proper functioning of said programmable delay line based on said comparing.

9. The method of claim 1, further comprising:
   programming an on-chip programmable delay line to create a high precision test clock for a launch time of at least one pattern generator, said launch time based on an optimal tap selection of said on-chip programmable delay line based on a simulation of a routed design of said signal paths;
   generating a test pattern based on said launch time; and
   indicating a result of a comparison between a test pattern received over said signal path to said test pattern generated based on said launch time.

10. The method of claim 6, routing of said signal paths being maintained under test.

11. The method of claim 6, further comprising grouping said signal paths into a plurality of independent groups based on common elements and selecting paths from said plurality of independent groups enabling simultaneous testing.

12. A method of delay fault testing an integrated circuit comprising:
   creating a plurality of scan-enable gating groups, said plurality of scan-enable gating groups comprising elements defining signal paths between components within said integrated circuit, each of said elements of said plurality of scan-enable gating groups sharing clock frequency and at least one additional shared characteristic; and
   selectively connecting at least one test signal through at least one low-speed gate transistor to said elements comprising said plurality of scan-enable gating groups using low-speed gating and based on membership in said scan-enable gating group, all members of each scan-enable gating group being connected to a common test signal.

13. The method of claim 12, further comprising:
   programming an on-chip programmable delay line for a launch time of at least one pattern generator, said launch time being based on a simulation of delays in said signal paths and a tap selection of said on-chip programmable delay line;
   generating a test pattern based on said launch time; and
   indicating a result of a comparison between a test pattern received over said signal path to said test pattern generated based on said launch time.

14. The method of claim 13, at least one of said plurality of pre-designed cores being implemented using field programmable gate arrays.

15. An integrated circuit structure comprising:
- a plurality of scan-enable gating groups, said plurality of scan-enable gating groups comprising elements defining signal paths between components within said integrated circuit, each of said elements of said plurality of scan-enable gating groups sharing clock frequency and at least one additional shared characteristic; and
- at least one low-speed gate transistor selectively connecting at least one test signal through to said elements;
- said elements comprising said plurality of scan-enable gating groups;
- said low speed gate transistor connected based on said elements membership in said scan-enable gating group, all members of each scan-enable gating group being connected to a common test signal.

16. The integrated circuit structure of claim 15, said at least one additional shared characteristic comprising at least one of: latency, skew and cross-domain signal paths.

17. The integrated circuit structure of claim 15, at least one of said elements of said integrated circuit being based on a plurality of pre-designed cores and said gating of at least one test signal to at least one of said plurality of pre-designed cores being enabled with a single gate.

18. The integrated circuit structure of claim 15, at least two of said elements being slow logic elements selectively enabled by a single gate.

19. The integrated circuit structure of claim 15, at least two of said elements being multi-cycle elements selectively enabled by a single gate.

20. The integrated circuit structure of claim 15, further comprising:
- at least one test pattern generator, said at least one test pattern generator generating a test pattern over at least one of said signal paths;
- an on-chip programmable delay line for programming a delayed launch time for said test pattern, said launch time being based on delays predicted in said at least one signal paths, said delayed launch time being based on a tap selection of said on-chip programmable delay line; and
- an output result analyzer that indicates a result of a comparison between a test signal received over at least one of said signal paths and said test pattern generated by said at least one test pattern generator.

21. The integrated circuit of claim 20, at least one of said plurality of pre-designed cores being implemented using field programmable gate arrays.

22. An integrated circuit with built-in self test structures comprising:
- low speed gates for selectively gating at least one test signal to elements comprising a plurality of scan-enable gating groups, said scan-enable gating groups comprising elements defining signal paths between components of said integrated circuit and sharing clock frequency and at least one additional shared characteristic, all members of each scan-enable gating group being connected to a common test signal.

23. The integrated circuit with built-in self-test structures of claim 22, further comprising:
- at least one test pattern generator, said at least one test pattern generator generating a test pattern over at least one of said signal paths;
- an on-chip programmable delay line for programming a delayed launch time for said test pattern, said launch time being based on delays predicted in said at least one signal paths, said delayed launch time being based on a tap selection of said on-chip programmable delay line; and
- an output result analyzer that indicates a result of a comparison between a test signal received over at least one of said signal paths and said test pattern generated by said at least one test pattern generator.

24. The integrated circuit of claim 23, at least one of said plurality of pre-designed cores being implemented using field programmable gate arrays.

25. A program storage device readable by machine tangibly embodying a program of instructions executable by said machine for performing a method of delay fault testing of an integrated circuit, said method comprising the steps of:
- creating a plurality of test clock gating groups, said plurality of test clock gating groups comprising elements defining signal paths between components within said integrated circuit, each of said elements of said plurality of test clock gating groups sharing clock frequency and at least one additional shared characteristic; and
- selectively connecting at least one test signal through at least one low-speed gate transistor to each of said elements comprising said plurality of test clock gating groups based on membership in said test clock gating group, all members of each test clock gating group being connected to a common test signal.

* * * * *